US008922753B2

(12) United States Patent
Kraehmer et al.

(10) Patent No.: US 8,922,753 B2
(45) Date of Patent: Dec. 30, 2014

(54) OPTICAL SYSTEM FOR A MICROLITHOGRAPHIC PROJECTION EXPOSURE APPARATUS

(71) Applicant: Carl Zeiss SMT GmbH, Oberkochen (DE)

(72) Inventors: Daniel Kraehmer, Essingen (DE); Ingo Saenger, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/179,722

(22) Filed: Feb. 13, 2014

(65) Prior Publication Data

US 2014/0268085 A1 Sep. 18, 2014

Related U.S. Application Data

(60) Provisional application No. 61/781,905, filed on Mar. 14, 2013.

(51) Int. Cl.
*G03B 27/72* (2006.01)
*G03B 27/54* (2006.01)
*G03F 7/20* (2006.01)
*G02B 27/28* (2006.01)

(52) U.S. Cl.
CPC .......... *G03F 7/70566* (2013.01); *G02B 27/286* (2013.01)
USPC .............................................. 355/71; 355/67

(58) Field of Classification Search
CPC ... G02B 1/08; G03F 7/70141; G03F 7/70258; G03F 7/70566
USPC ............... 355/52, 53, 55, 67, 71; 359/486.01, 359/492.01
See application file for complete search history.

(56) References Cited

U.S. PATENT DOCUMENTS

| 6,191,880 | B1 | 2/2001 | Schuster |
| 8,031,326 | B2 | 10/2011 | Totzeck et al. |
| 8,379,188 | B2 | 2/2013 | Mueller et al. |
| 2007/0146676 | A1 | 6/2007 | Tanitsu |
| 2007/0279613 | A1 | 12/2007 | Fiolka et al. |

(Continued)

FOREIGN PATENT DOCUMENTS

| DE | 10 2004 011 733 A1 | 9/2005 |
| DE | 10 2007 055 567 A1 | 5/2009 |

(Continued)

OTHER PUBLICATIONS

German Office Action, with translation thereof, for corresponding DE Appl No. 10 2013 204 453.4, dated Nov. 20, 2013.

*Primary Examiner* — Hung Henry Nguyen
(74) *Attorney, Agent, or Firm* — Fish & Richardson P.C.

(57) ABSTRACT

The invention relates to an optical system for a microlithographic projection exposure apparatus, including an optical system axis (OA) and a polarization-influencing optical arrangement, wherein the polarization-influencing optical arrangement includes a first polarization-influencing element, which is produced from optically uniaxial crystal material and has a first orientation of the optical crystal axis, the-first orientation being perpendicular to the optical system axis and a thickness that varies in the direction of the optical system axis, and a second polarization-influencing element, which is arranged downstream of the first polarization-influencing element in the light propagation direction, is produced from optically uniaxial crystal material and has a second orientation of the optical crystal axis, the second orientation being perpendicular to the optical system axis, and a plane-parallel geometry, wherein the second orientation is different from the first orientation.

22 Claims, 5 Drawing Sheets

(56) References Cited

U.S. PATENT DOCUMENTS

2009/0115989 A1* 5/2009 Tanaka ........................ 355/71
2011/0063597 A1 3/2011 Mengel

FOREIGN PATENT DOCUMENTS

| | | |
|---|---|---|
| DE | 10 2008 009 601 A1 | 8/2009 |
| EP | 1 306 665 A2 | 5/2003 |
| JP | 2010-141091 A | 6/2010 |
| WO | WO 2005/026843 | 3/2005 |
| WO | WO 2005/031467 A2 | 4/2005 |
| WO | WO 2005/069081 A2 | 7/2005 |
| WO | WO 2008/019936 A2 | 2/2008 |
| WO | WO 2009/034109 A2 | 3/2009 |
| WO | WO 2009/100862 A1 | 8/2009 |

* cited by examiner

Fig. 4
a)
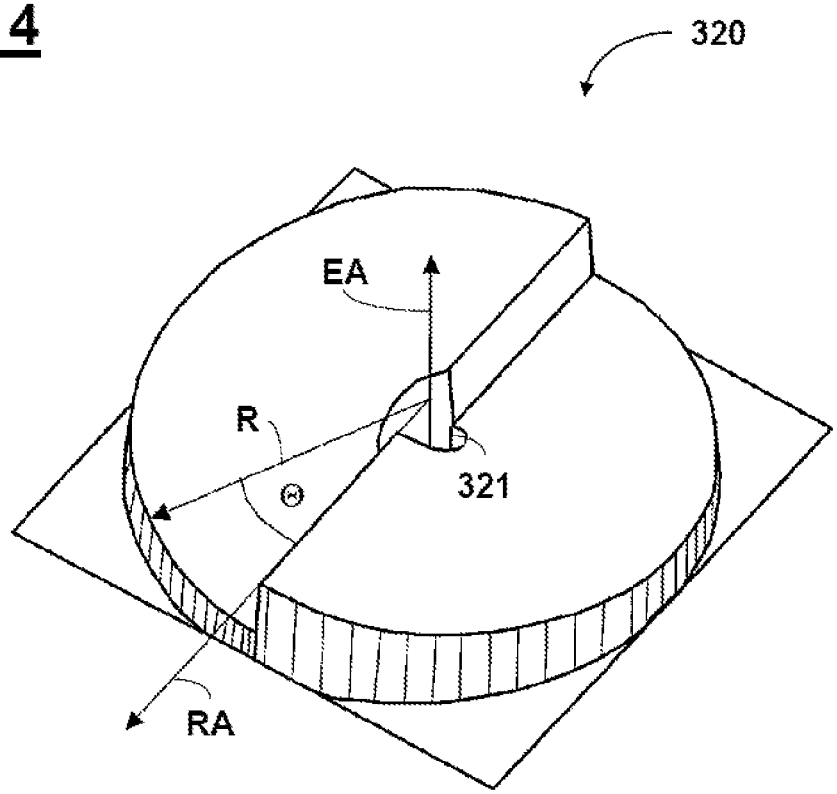
b)
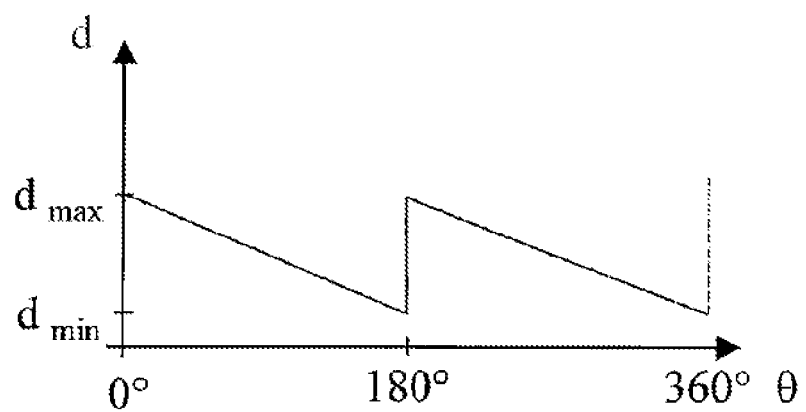

OPTICAL SYSTEM FOR A MICROLITHOGRAPHIC PROJECTION EXPOSURE APPARATUS

CROSS-REFERENCE TO RELATED APPLICATIONS

This application claims priority under 35 U.S.C. §119(e) (1) to U.S. Provisional Application No. 61/781,905, filed Mar. 14, 2013, the entire contents of which are hereby incorporated by reference.

The invention relates to an optical system for a microlithographic projection exposure apparatus.

Microlithographic projection exposure apparatuses are used for producing microstructured components, such as, for example, integrated circuits or LCDs. Such a projection exposure apparatus comprises an illumination device and a projection lens. In the microlithography process, the image of a mask (=reticle) illuminated with the aid of the illumination device is projected, via the projection lens, onto a substrate (e.g. a silicon wafer) coated with a light-sensitive layer (photoresist) and arranged in the image plane of the projection lens, in order to transfer the mask structure to the light-sensitive coating of the substrate.

During the operation of a microlithographic projection exposure apparatus there is a need to set defined illumination settings, i.e. intensity distributions in a pupil plane of the illumination device, in a targeted manner. Furthermore, various approaches are known for setting specific polarization distributions in the illumination pupil in a targeted manner in the illumination device for the purpose of optimizing the imaging contrast.

In particular, it is known, both in the illumination device and in the projection lens, to set a tangential polarization distribution for high-contrast imaging. "Tangential polarization" (or "TE polarization") is understood to mean a polarization distribution for which the oscillation planes of the electric field strength vectors of the individual linearly polarized light rays are oriented approximately perpendicularly to the radius directed to the optical system axis. By contrast, "radial polarization" (or "TM polarization") is understood to mean a polarization distribution for which the oscillation planes of the electric field strength vectors of the individual linearly polarized light rays are oriented approximately radially with respect to the optical system axis. Accordingly, a quasi-tangential or a quasi-radial polarization distribution is understood to mean a polarization distribution for which the above criteria are at least approximately satisfied.

With regard to the prior art, reference is made for example to WO 2005/069081 A2, WO 2005/031467 A2, U.S. Pat. No. 6,191,880 B1, US 2007/0146676 A1, WO 2009/034109 A2, WO 2008/019936 A2, WO 2009/100862 A1, DE 10 2008 009 601 A1, DE 10 2004 011 733 A1 and EP 1 306 665 A2.

It is an object of the present invention to provide an optical system for a microlithographic projection exposure apparatus, which optical system makes it possible to generate a desired polarization distribution in the projection exposure apparatus in a comparatively simple manner.

This object is achieved in accordance with an optical system for a microlithographic projection exposure apparatus, including an optical system axis and a polarization-influencing optical arrangement. The polarization-influencing optical arrangement includes: a first polarization-influencing element, which is produced from optically uniaxial crystal material and has a first orientation of the optical crystal axis, the first orientation being perpendicular to the optical system axis and a thickness that varies in the direction of the optical system axis; and a second polarization-influencing element, which is arranged downstream of the first polarization-influencing element in the light propagation direction, is produced from optically uniaxial crystal material and has a second orientation of the optical crystal axis, the second orientation being perpendicular to the optical system axis, and a plane-parallel geometry, wherein the second orientation is different from the first orientation.

An optical system according to the invention for a microlithographic projection exposure apparatus comprises an optical system axis and a polarization-influencing optical arrangement, wherein the polarization-influencing optical arrangement comprises:

- a first polarization-influencing element, which is produced from optically uniaxial crystal material and has a first orientation of the optical crystal axis, the first orientation being perpendicular to the optical system axis and a thickness that varies in the direction of the optical system axis; and
- a second polarization-influencing element, which is arranged downstream of the first polarization-influencing element in the light propagation direction, is produced from optically uniaxial crystal material and has a second orientation of the optical crystal axis, the second orientation being perpendicular to the optical system axis, and a plane-parallel geometry, wherein the second orientation is different from the first orientation.

The invention is based on the consideration that, in principle, via the combination of three linear retarders (i.e. of three polarization-influencing optical elements which, on account of linear birefringence, bring about a retardation, i.e. an optical path difference between two orthogonal or mutually perpendicular polarization states), an arbitrary elliptical retarder can be physically realized depending on the configuration of the linear retarders. In this case, an "elliptical retarder" is understood as the definition of a polarization-influencing optical element that is generalized insofar as the rotation of a predefined polarization state that is brought about by such an elliptical retarder can be obtained arbitrarily on the Poincaré sphere.

The concept of the Poincaré sphere that underlies this consideration is illustrated schematically in FIG. 5. In this case, a linear retarder has the effect of a rotation of a polarization state on the Poincaré sphere about an axis lying in the equator plane of the Poincaré sphere (for example about the axis "A" or "B" in FIG. 5). It can then be shown mathematically that any arbitrary elliptical retarder (which brings about the rotation of a polarization state on the Poincaré sphere about an arbitrary axis, e.g. the axis "D" in FIG. 5) can be realized via the combination of three linear retarders each having a predefined, constant direction of the fast axis of birefringence or the optical crystal axis.

Proceeding from the above consideration, the invention is then based on the concept, in particular, of achieving a variations of the direction of polarization that is continuous over the light beam cross section (i.e. the effect of a rotator with a continuously varying polarization rotation angle, corresponding to a rotation of a polarization state on the Poincaré sphere about the axis "C" in FIG. 5) via a combination of a maximum of three linear retarders. In this case, firstly it is possible to dispense with the use of optical activity or the use of optically active materials, and, secondly, with regard to the retarders used, it is possible to have recourse to naturally available crystal material having in each case a uniform orientation of the optical crystal axis (wherein, in particular, it is not necessary to set any local variation of the direction of the optical crystal axis in the respective material).

In principle, a general linear retarder can be described by the following Jones matrix J:

$$J = \begin{pmatrix} \cos\frac{\Delta\phi}{2} - i\sin\frac{\Delta\phi}{2}\cdot\cos2\beta & -i\sin\frac{\Delta\phi}{2}\cdot\sin2\beta \\ -i\sin\frac{\Delta\phi}{2}\cdot\sin2\beta & \cos\frac{\Delta\phi}{2} + i\sin\frac{\Delta\phi}{2}\cdot\cos2\beta \end{pmatrix} \quad (1)$$

wherein $\Delta\phi$ denotes the phase retardation (which results from the multiplication of the optical path difference for orthogonal polarization states by $2\pi$/lambda, wherein lambda denotes the operating wavelength) and $\beta$ denotes the angle of the optical crystal axis.

The Jones matrix $J_{target}$ of a rotator sought according to the invention generally reads $$J_{target} = \begin{pmatrix} \cos\alpha & -\sin\alpha \\ \sin\alpha & \cos\alpha \end{pmatrix} \quad (2)$$

According to the invention, the following formulation of the combination of three linear retarders each having a predefined, constant direction of the fast axis of birefringence is now chosen:

$$J_{target} \stackrel{!}{=} J_3 \cdot J_2 \cdot J_1 \quad (3)$$

wherein $J_1$ denotes the Jones matrix of a retarder with $\beta=0°$ and phase retardation $\Delta\phi_1$, i.e.

$$J_1 = \begin{pmatrix} \exp(-i\Delta\phi_1/2) & 0 \\ 0 & \exp(+i\Delta\phi_1/2) \end{pmatrix} \quad (4)$$

$J_2$ denotes the Jones matrix of a retarder with $\beta=45°$ and phase retardation $\Delta\phi_2$, i.e.

$$J_2 = \begin{pmatrix} \cos(\Delta\phi_2/2) & -i\sin(\Delta\phi_2/2) \\ -i\sin(\Delta\phi_2/2) & \cos(\Delta\phi_2/2) \end{pmatrix} \quad (5)$$

and $J_3$ denotes the Jones matrix of a retarder with $\beta=0°$ and phase retardation $\Delta\phi_3$, i.e.

$$J_3 = \begin{pmatrix} \exp(-i\Delta\phi_3/2) & 0 \\ 0 & \exp(+i\Delta\phi_3/2) \end{pmatrix} \quad (6)$$

From (4)-(6) it follows that:

$$J_3 \cdot J_2 \cdot J_1 = \begin{pmatrix} \exp\left(-\frac{i}{2}(\Delta\phi_1+\Delta\phi_3)\right)\cdot \cos(\Delta\phi_2/2) & i\exp\left(\frac{i}{2}(\Delta\phi_1-\Delta\phi_3)\right)\cdot \sin(\Delta\phi_2/2) \\ -i\exp\left(-\frac{i}{2}(\Delta\phi_1-\Delta\phi_3)\right)\cdot \sin(\Delta\phi_2/2) & \exp\left(\frac{i}{2}(\Delta\phi_1+\Delta\phi_3)\right)\cdot \cos(\Delta\phi_2/2) \end{pmatrix}$$

$$= \begin{pmatrix} \cos\alpha & -\sin\alpha \\ \sin\alpha & \cos\alpha \end{pmatrix} \quad (7)$$

which results in the following solution for the respective phase retardations $\Delta\phi_1$, $\Delta\phi_2$ and $\Delta\phi_3$:

$$\Delta\phi_1 = -\frac{\pi}{2}, \quad (8)$$
$$\Delta\phi_2 = 2\alpha,$$
$$\Delta\phi_3 = \frac{\pi}{2}$$

The solution according to (8) thus corresponds to a polarization-influencing optical arrangement comprising a lambda/4 plate having a 90° orientation of the optical crystal axis (relative to a predefined direction, e.g. the y-direction in a fixedly predefined coordinate system), a linear retarder having a 45° orientation of the optical crystal axis (relative to the predefined direction, e.g. the y-direction) and a phase retardation of $\Delta\phi_2=2\alpha$ and a further lambda/4 plate having a 0° orientation of the optical crystal axis (relative to the predefined direction, e.g. the y-direction). For the generation—sought according to the invention—of a polarization rotation angle $\alpha$ that varies in a location-dependent manner, therefore, the linear retarder having the 45° orientation of the optical crystal axis also has a phase retardation $\Delta\phi_2$ that varies in a location-dependent manner or over the light beam cross section.

Specifically, a polarization-influencing optical arrangement used according to the invention for effectively embodying a rotator having a polarization rotation angle that varies over the light beam cross section comprises at least two linear retarders, of which one has a thickness profile that varies in the light propagation direction or in the direction of the optical system axis and the further retarder, disposed downstream in the light propagation direction, has a plane-parallel geometry, and wherein these two linear retarders each have orientations of the optical crystal axis that are perpendicular to the optical system axis and that are different from one another.

Depending on the specific constitution of the input polarization distribution of the light incident on the polarization-influencing optical arrangement according to the invention, in order to achieve the desired output polarization distribution, as explained in even greater detail below, in addition a third linear retarder can also be used, which likewise has a plane-parallel geometry and is arranged upstream of the first and second linear retarders relative to the light propagation direction.

In accordance with one embodiment, the first polarization-influencing element and the second polarization-influencing element are arranged directly successively in the light propagation direction.

In accordance with one embodiment, the polarization-influencing optical arrangement furthermore comprises a third polarization-influencing element, which is arranged upstream of the first polarization-influencing element in the light propagation direction, is produced from optically uniaxial crystal material and has a third orientation of the optical crystal axis, the third orientation being perpendicular to the optical system axis, and a plane-parallel geometry.

In accordance with one embodiment, the first, second and third polarization-influencing elements are arranged directly successively in the light propagation direction.

In accordance with one embodiment, the second orientation of the optical crystal axis of the second polarization-influencing element and the third orientation of the optical crystal axis of the third polarization-influencing element run perpendicularly to one another.

In accordance with one embodiment, the first orientation of the optical crystal axis of the first polarization-influencing element runs at an angle of in terms of absolute value 45°±5° with respect to the second orientation of the optical crystal axis of the second polarization-influencing element and with respect to the third orientation of the optical crystal axis of the third polarization-influencing element.

In accordance with one embodiment, the first polarization-influencing element has a wedge-shaped or wedge-section-shaped geometry.

In accordance with one embodiment, the first polarization-influencing element has a thickness profile which varies in an azimuthal direction relative to the optical system axis and is constant in a radial direction relative to the optical system axis.

In accordance with one embodiment, the second polarization-influencing element has a retardation of lambda/4, wherein lambda denotes the operating wavelength of the optical system.

In accordance with one embodiment, the third polarization-influencing element has a retardation of lambda/4, wherein lambda denotes the operating wavelength of the optical system.

In accordance with one embodiment, the optically uniaxial crystal material is selected from the group containing magnesium fluoride ($MgF_2$), sapphire ($Al_2O_3$) and crystalline quartz ($SiO_2$).

In accordance with one embodiment, the polarization-influencing optical arrangement converts a constantly linear input polarization distribution of light incident on the arrangement into an output polarization distribution having a direction of polarization that varies continuously over the light beam cross section.

In accordance with one embodiment, the polarization-influencing optical arrangement converts a constantly linear input polarization distribution of light incident on the arrangement into an at least approximately tangential output polarization distribution.

In accordance with one embodiment, the polarization-influencing optical arrangement is arranged in a pupil plane of the optical system.

The invention furthermore relates to a microlithographic projection exposure apparatus and to a method for microlithographically producing microstructured components.

Further configurations of the invention can be gathered from the description and from the dependent claims The invention is explained in greater detail below on the basis of exemplary embodiments illustrated in the accompanying figures.

In the figures:

FIGS. 2-4 show schematic illustration for elucidating the construction and the functioning of embodiments of a polarization-influencing optical arrangement according to the present invention.

Firstly, a possible construction of a microlithographic projection exposure apparatus is explained below with reference to FIG. 1 in a simplified, schematic illustration.

Figure 1:
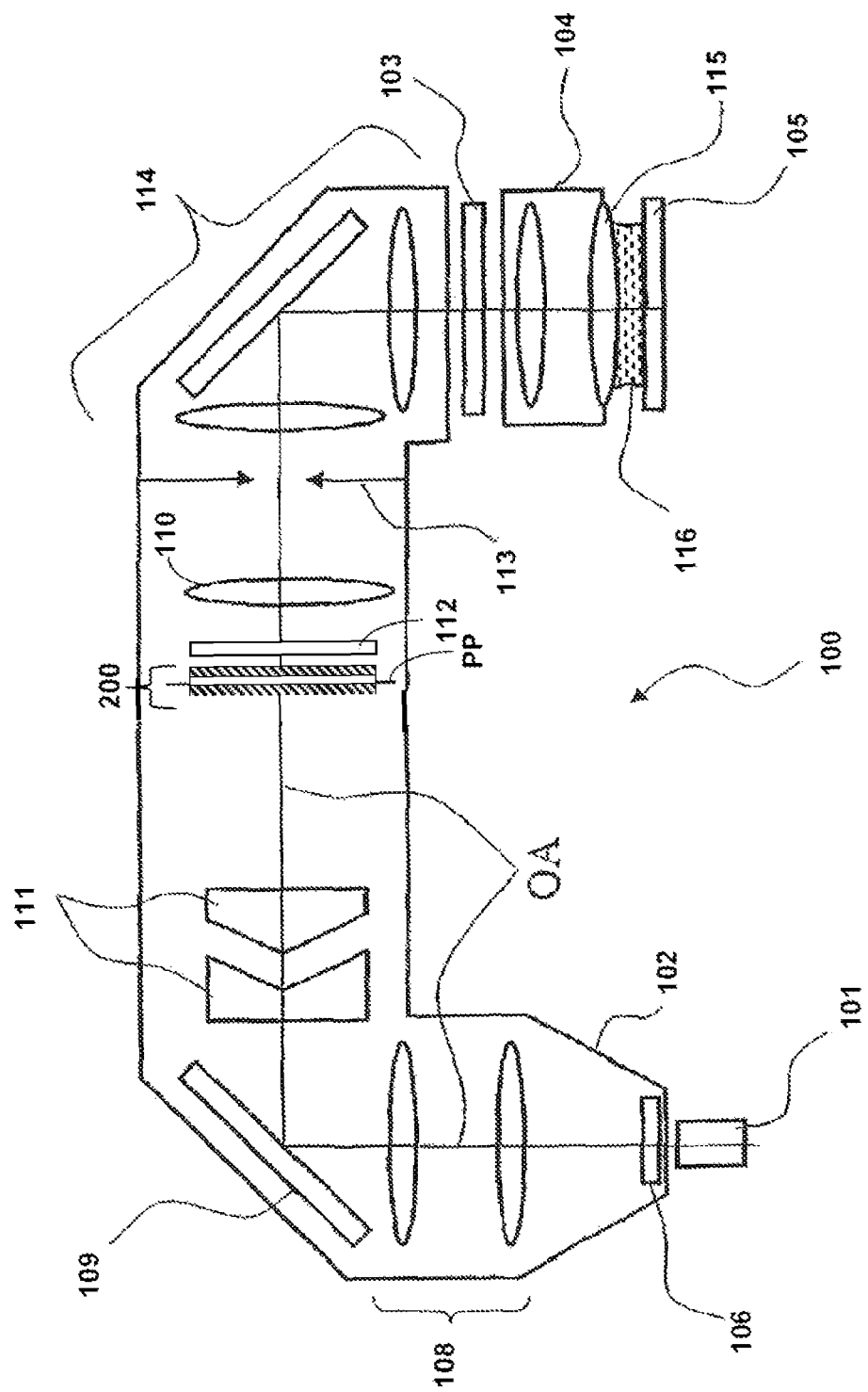
FIG. 1 shows a schematic illustration of the possible construction of a microlithographic projection exposure apparatus.

The microlithographic projection exposure apparatus 100 in accordance with FIG. 1 comprises a light source unit 101, an illumination device 102, a structure-bearing mask 103, a projection lens 104 and a substrate 105 to be exposed. The light source unit 101 can comprise as light source for example an ArF laser for an operating wavelength of 193 nm and a beam shaping optical unit that generates a parallel light beam. A parallel light beam emitted by the light source unit 101 is incident firstly on a diffractive optical element (DOE) 106. The DOE 106 generates a desired intensity distribution, e.g. dipole or quadrupole distribution, in a pupil plane PP via an angular emission characteristic defined by the respective diffractive surface structure. A lens 108 disposed downstream of the DOE 106 in the beam path is designed as a zoom lens, which generates a parallel light beam having a variable diameter. The parallel light beam is directed onto an axicon 111 by a deflection mirror 109. Via the zoom lens 108 in conjunction with the upstream DOE 106 and the axicon 111, different illumination configurations are generated in the pupil plane PP, depending on the zoom setting and position of the axicon elements.

In accordance with FIG. 1, there is situated in the pupil plane PP a polarization-influencing optical arrangement 200, with regard to which possible embodiments are explained below with reference to FIG. 2 et seq.

The illumination device 102 furthermore comprises, downstream of the axicon 111, a light mixing system 112 arranged in the region of the pupil plane PP (directly downstream thereof in FIG. 1), which light mixing system can comprise e.g. an arrangement of micro-optical elements suitable for achieving light mixing. The light mixing system 112 and, if appropriate, further optical components (merely indicated by a single lens element 110) are followed by a reticle masking system (REMA), 113, which is imaged onto the reticle 103 by a REMA lens 114 and thereby delimits the illuminated region on the reticle 103. The reticle 103 is imaged onto the light-sensitive substrate 105 via the projection lens 104. In the example illustrated, an immersion liquid 116 having a refractive index different from that of air is situated between a last optical element 115 of the projection lens 104 and the light-sensitive substrate 105.

In further embodiments, the illumination device 102, for generating different illumination configurations, can also comprise a likewise known mirror arrangement comprising a multiplicity of mutually independently adjustable mirror elements, as known e.g. from WO 2005/026843 A2.

Possible embodiments of the polarization-influencing optical arrangement 200 situated in the pupil plane PP in accordance with FIG. 1 will now be explained below, with construction and functioning, with reference to FIG. 2 et seq.

In accordance with FIG. 2, the polarization-influencing optical arrangement 200 in a first embodiment comprises a wedge-section-shaped polarization-influencing optical element 220 (also designated hereinafter as "first polarization-influencing element") having a thickness that varies in the light propagation direction (corresponding to the z-direction in the coordinate system depicted), between two plane-parallel polarization-influencing optical elements 210 and 230, where the latter are arranged directly upstream and respectively downstream of the (first) wedge-section-shaped polarization-influencing optical element 220 relative to the light propagation direction.

The polarization-influencing elements 210, 220 and 230 are in each case produced from optically uniaxial crystal material having sufficient transmission at the respective operating wavelength, for example from magnesium fluoride ($MgF_2$), sapphire ($Al_2O_3$) or crystalline quartz ($SiO_2$), at an exemplary operating wavelength of approximately 193 nm. For these materials, the difference between the extraordinary refractive index $n_e$ and the ordinary refractive index $n_o$ is respectively $n_e - n_o$ (SiO$_2$)≅+0.013, $n_e - n_o$ (Al$_2$O$_3$)≅−0.011 and $n_e - n_o$ (MgF$_2$)≅+0.014.

In the specific exemplary embodiment, for the polarization-influencing elements 210 and 230, the retardation (which is constant over the light beam cross section owing to their plane-parallel configuration) is in each case lambda/4, wherein the lambda denotes the operating wavelength of the optical system. The direction of the optical crystal axis is in each case symbolized by the depicted double-headed arrows for the polarization-influencing optical elements 210, 220 and 230 in FIG. 2 and, in the specific exemplary embodiment, relative to the coordinate system depicted, runs parallel to the y-direction for the element 210, parallel to the x-direction for the element 230, and at an angle of 45° with respect to the x-direction and y-direction for the element 220.

Figure 2:
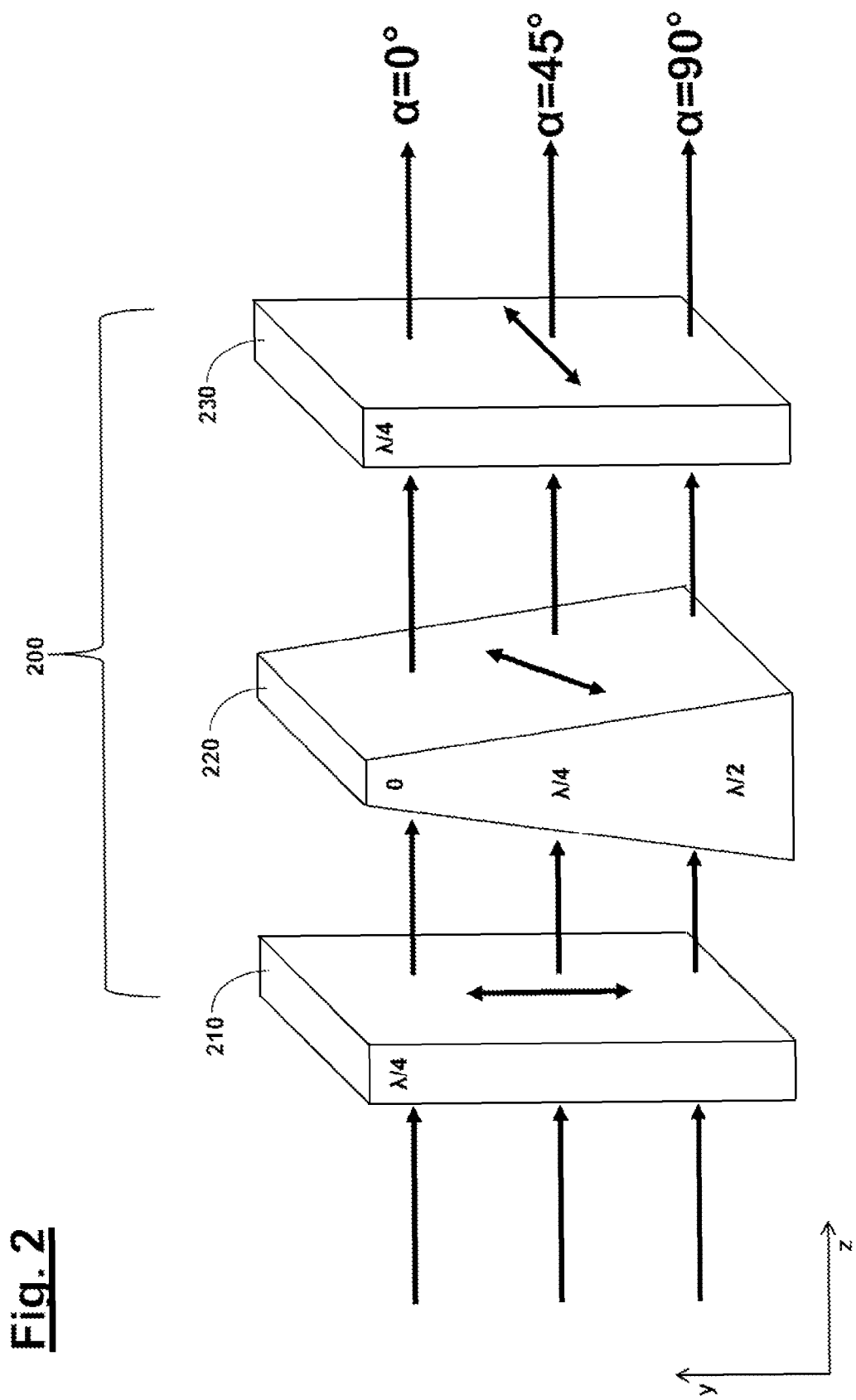

FIG. 2 likewise indicates the polarization rotation angle α achieved overall in a location-dependent manner by the polarization-influencing optical arrangement 200, the polarization rotation angle varying over the light beam cross section along the y-direction between 0° and 90° in the specific exemplary embodiment, which is brought about in particular by the wedge-section-shaped configuration of the polarization-influencing element 220.

The above-described generation—realized by the polarization-influencing optical arrangement 200—of polarization states that vary continuously in a location-dependent manner or over the light beam cross section can be used, for example, to generate a desired polarized illumination setting in the illumination device via suitable distribution of the polarization states (e.g. using a mirror arrangement comprising a multiplicity of mutually independently adjustable mirror elements). In further applications, it is also possible to bring about at least partial compensation of an undesired disturbance of the polarization state that is present in the illumination device or in the projection lens.

The construction and the functioning of a polarization-influencing optical arrangement 300 in accordance with a further embodiment of the present invention will be explained below with reference to FIG. 3 and FIG. 4.

Figure 3:
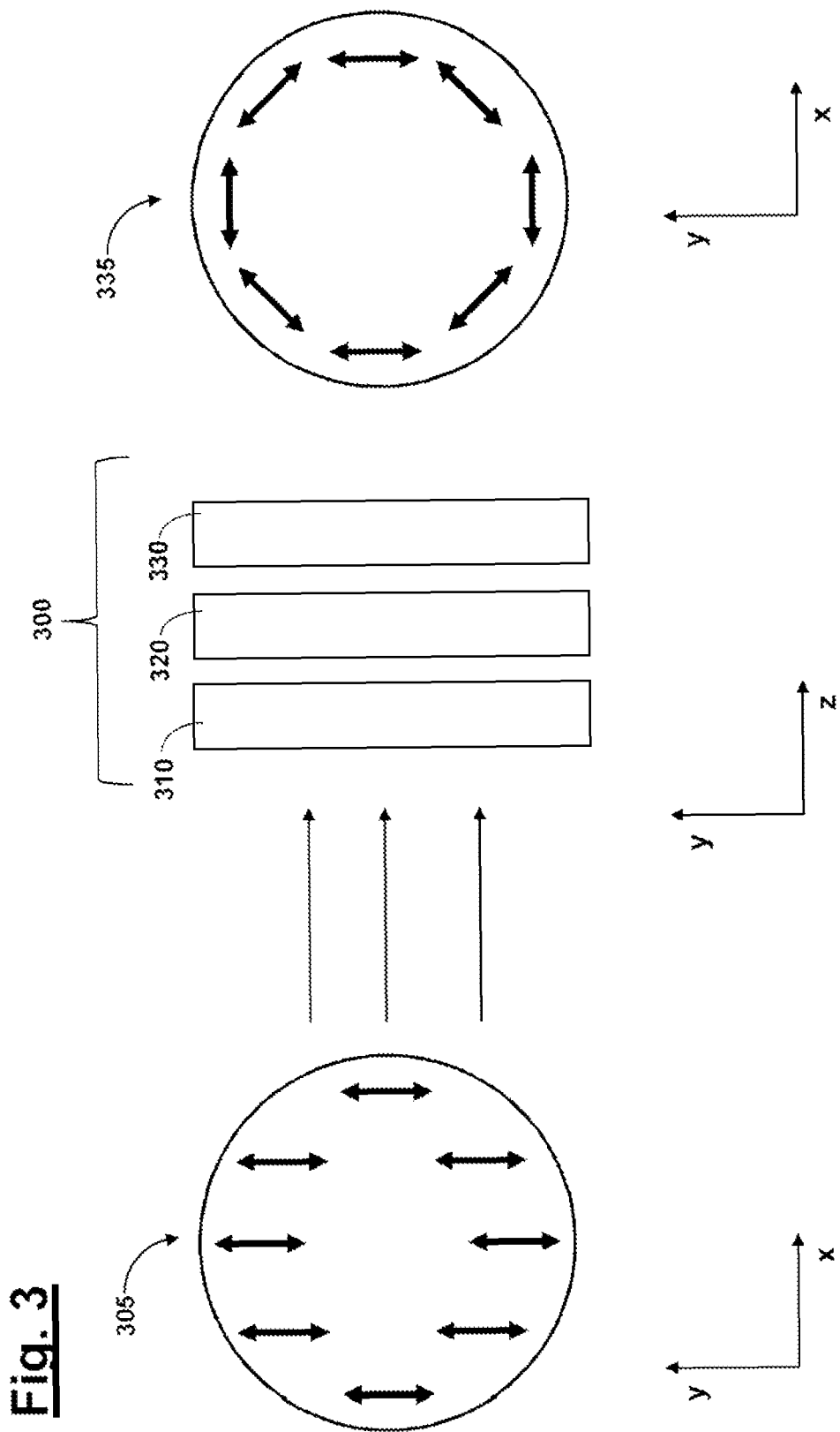
Figure 5:
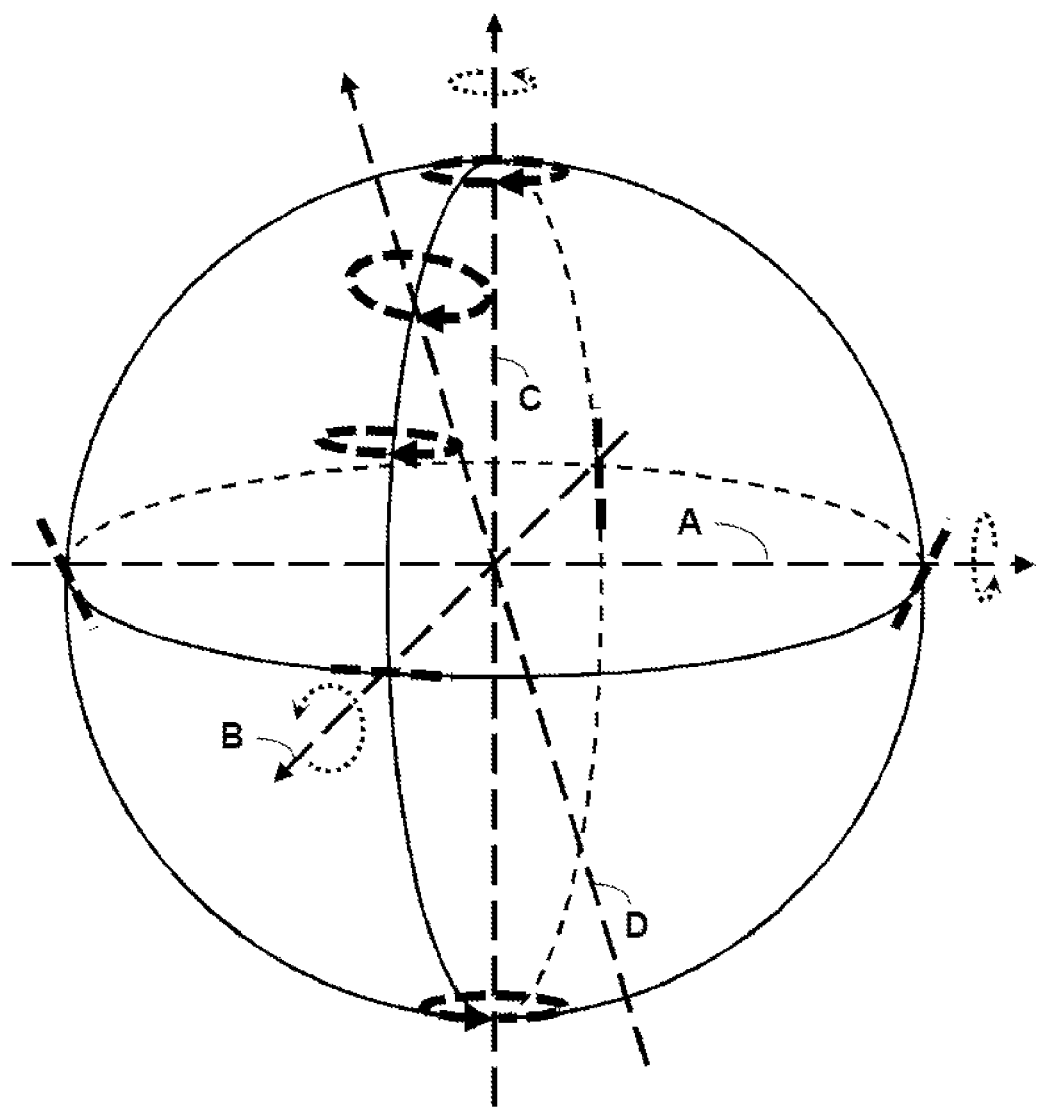
FIG. 5 shows a schematic illustration of the Poincaré sphere for elucidating the manner of operation of different retarders.

The polarization-influencing optical arrangement 300 serves, as indicated in FIG. 3, to convert a constantly linear input polarization distribution 305 into an at least approximately tangential output polarization distribution 335. In contrast to the polarization-influencing optical arrangement 200 from FIG. 2, in the case of the polarization-influencing optical arrangement 300, the central polarization-influencing optical element 320 is not embodied in a wedge-section-shaped fashion, but has a thickness profile which, as shown in FIGS. 4*a*, *b*, varies in an azimuthal direction relative to the optical system axis (i.e. the z-direction) and is constant in a radial direction relative to the optical system axis. In the embodiment illustrated schematically in FIG. 4*a*, the polarization-influencing optical element 320 has a constant thickness along a radius R that is perpendicular to the element axis EA and that forms an angle θ with a reference axis RA. In this embodiment, therefore, the thickness profile is dependent only on the azimuth angle θ. A central hole 321 is situated in the center of the polarization-influencing optical element 320.

FIG. 4*a* shows the exemplary thickness profile in a perspective illustration, and FIG. 4*b* shows, for this thickness profile, a diagram in which the thickness d is plotted as a function of the azimuth angle Θ. In the exemplary embodiment, the thickness profile has a jump at Θ=180°, the difference in thickness at this jump corresponding to a retardation of lambda (or an integral multiple of lambda). Furthermore, the polarization-influencing optical element 320 in the exemplary embodiment is composed of two partial elements or has a segmented construction. However, the invention is not restricted thereto. In further embodiments, a construction comprising more (e.g. four) segments or else a non-segmented or integral construction and a thickness profile that is continuous throughout (i.e. without a jump in the thickness profile) can also be chosen instead.

The polarization-influencing optical elements 310 and 330 arranged upstream and respectively downstream of the element 320 relative to the light propagation direction are configured with plane-parallel geometry and a constant retardation of lambda/4 analogously to the exemplary embodiment from FIG. 2.

Analogously to the exemplary embodiment from FIG. 2, at an exemplary operating wavelength of approximately 193 nm, the polarization-influencing elements 310, 320 and 330 can be produced, for example, from magnesium fluoride (MgF$_2$), sapphire (Al$_2$O$_3$) or crystalline quartz (SiO$_2$). In this case, the maximum height difference of the polarization-influencing optical element 320, which difference must be present in the thickness profile of the element 320 in order to provide a retardation in the range of −λ/2 to +λ/2, is approximately in the region of 15 μm.

Even though an arrangement 200 and 300 respectively formed from a combination of three polarization-influencing optical elements is used in the embodiments described above with reference to FIG. 2 and FIG. 3, the invention is not restricted thereto. Rather, it should be pointed out that, depending on the constitution of the input polarization distribution of the light incident on the polarization-influencing optical arrangement according to the invention, in order to generate the desired output polarization distribution, two polarization-influencing optical elements (the elements 220, 230 and 320, 330, in the exemplary embodiments described above) may also already suffice. This is because, if the input polarization distribution of the light incident on the respective polarization-influencing optical arrangement is constantly linear (for example having a direction of polarization running in the y-direction), a lambda/4 plate (corresponding to the elements 210 from FIGS. 2 and 310 from FIG. 3) having an optical crystal axis likewise oriented in the y-direction, for example, has no influence on the input polarization distribution (wherein, in the example mentioned, the light is incident in the eigenstate on the respective element 210 and 310.

Even though the invention has been described on the basis of specific embodiments, numerous variations and alternative embodiments are evident to the person skilled in the art, e.g. by combination and/or exchange of features of individual embodiments. Accordingly, it goes without saying for the person skilled in the art that such variations and alternative embodiments are concomitantly encompassed by the present invention, and the scope of the invention is restricted only within the meaning of the accompanying patent claims and the equivalents thereof.

The invention claimed is:

1. An optical system having an optical axis, the optical system comprising:
   a polarization-influencing optical arrangement, comprising:
      a first polarization-influencing element comprising a first optically uniaxial crystal material, the first optically uniaxial material having an optical crystal axis perpendicular to the optical axis of the optical system, the first polarization-influencing element having a thickness that varies in a direction of the optical axis of the optical system; and a second polarization-influencing element downstream of the first polarization-influencing element in a direction light propagates through the optical system during use of the optical system, the second polarization-influencing element comprising a second optically uniaxial crystal material, the second optically uniaxial material having an optical axis perpendicular to the optical axis of the optical system, the second polarization-influencing element having a plane-parallel geometry, wherein:
an orientation of the optical crystal axis of the first optically uniaxial material is different from an orientation of the optical crystal axis of the second optically uniaxial material;

during use of the optical system, the polarization-influencing optical arrangement converts a constantly linear input polarization distribution of light incident on the polarization-influencing arrangement into an output polarization distribution having a direction of polarization that varies continuously over a light beam cross section; and the optical system is a microlithographic optical system.

2. The optical system of claim 1, wherein the first and second polarization-influencing elements are in direct succession in the direction light propagates through the optical system during use of the optical system.

3. The optical system of claim 1, wherein the polarization-influencing optical arrangement further comprises a third polarization-influencing element upstream of the first polarization-influencing element in the direction light propagates through the optical system during use of the optical system, the third polarization-influencing element comprising a third optically uniaxial crystal material, the third optically uniaxial crystal material having an optical axis perpendicular to the optical system axis, the third polarization-influencing element having a plane-parallel geometry.

4. The optical system of claim 3, wherein the first, second and third polarization-influencing elements are in direct succession in the direction light propagates through the optical system during use of the optical system.

5. The optical system of claim 3, wherein the orientation of the optical crystal axis of the second optically uniaxial material is perpendicular to an orientation of the optical crystal axis of the third optically uniaxial material.

6. The optical system of claim 5, wherein the orientation of the optical crystal axis of the first optically uniaxial material is at an angle having an absolute value of 45°±5° with respect to the orientation of the optical crystal axis of the second optically uniaxial material.

7. The optical system of claim 3, wherein the orientation of the optical crystal axis of the first optically uniaxial material is at an angle having an absolute value of 45°±5° with respect to the orientation of the optical crystal axis of the third optically uniaxial material.

8. The optical system of claim 3, wherein the third polarization-influencing element has a retardation of lambda/4, wherein lambda denotes an operating wavelength of the optical system.

9. The optical system of claim 8, wherein the second polarization-influencing element has a retardation of lambda/4, and lambda denotes an operating wavelength of the optical system.

10. The optical system of claim 3, wherein the second polarization-influencing element has a retardation of lambda/4, and lambda denotes an operating wavelength of the optical system.

11. The optical system of claim 1, wherein the orientation of the optical crystal axis of the first optically uniaxial material is at an angle having an absolute value of 45°±5° with respect to the orientation of the optical crystal axis of the second optically uniaxial material.

12. The optical system of claim 1, wherein the first polarization-influencing element is wedge-section-shaped.

13. The optical system of claim 1, wherein the first polarization-influencing element has a thickness profile which: a) varies in an azimuthal direction relative to the optical axis of the optical system; and b) is constant in a radial direction relative to the optical axis of the optical system.

14. The optical system of claim 1, wherein the second polarization-influencing element has a retardation of lambda/4, and lambda denotes an operating wavelength of the optical system.

15. The optical system of claim 1, wherein the first optically uniaxial crystal material is selected from the group containing magnesium fluoride ($MgF_2$), sapphire ($Al_2O_3$) and crystalline quartz ($SiO_2$).

16. The optical system of claim 15, wherein the second optically uniaxial crystal material is selected from the group containing magnesium fluoride ($MgF_2$), sapphire ($Al_2O_3$) and crystalline quartz ($SiO_2$).

17. The optical system of claim 1, wherein the second optically uniaxial crystal material is selected from the group containing magnesium fluoride ($MgF_2$), sapphire ($Al_2O_3$) and crystalline quartz ($SiO_2$).

18. The optical system of claim 1, wherein the output polarization distribution is an at least approximately tangential output polarization distribution.

19. The optical system of claim 1, wherein the polarization-influencing optical arrangement is arranged in a pupil plane of the optical system.

20. A device, comprising:
an optical system according to claim 1,
wherein the device is a microlithographic illumination device.

21. An apparatus, comprising:
an illumination device comprising the optical system of claim 1; and
a projection lens,
wherein the apparatus is a microlithographic projection exposure apparatus.

22. A method of using a microlithographic projection exposure apparatus comprising an illumination device and a projection lens, the method comprising:
using the illumination device to illuminate a mask comprising structures; and
using the projection lens to projection at a portion of the mask onto a light-sensitive material,
wherein the illumination device comprises an optical system according to claim 1.

* * * * *

UNITED STATES PATENT AND TRADEMARK OFFICE
CERTIFICATE OF CORRECTION

| | | |
|---|---|---|
| PATENT NO. | : 8,922,753 B2 | Page 1 of 1 |
| APPLICATION NO. | : 14/179722 | |
| DATED | : December 30, 2014 | |
| INVENTOR(S) | : Daniel Kraehmer et al. | |

It is certified that error appears in the above-identified patent and that said Letters Patent is hereby corrected as shown below:

On the Title Page

Col. 2, line 8, under "ABSTRACT", delete "the-first" and insert -- the first --.

In the Specification

Col. 3, line 57, delete "
$$J_3 \cdot J_2 \cdot J_1 = \begin{pmatrix} \exp(-\tfrac{i}{2}(\Delta\phi_1+\Delta\phi_3)) \cdot \cos(\Delta\phi_2/2) & i\exp(\tfrac{i}{2}(\Delta\phi_1-\Delta\phi_3)) \cdot \sin(\Delta\phi_2/2) \\ -i\exp(-\tfrac{i}{2}(\Delta\phi_1-\Delta\phi_3)) \cdot \sin(\Delta\phi_2/2) & \exp(\tfrac{i}{2}(\Delta\phi_1+\Delta\phi_3)) \cdot \cos(\Delta\phi_2/2) \end{pmatrix}$$
$$= \begin{pmatrix} \cos\alpha & -\sin\alpha \\ \sin\alpha & \cos\alpha \end{pmatrix}$$
"

and insert --
$$J_3 \cdot J_2 \cdot J_1 = \begin{pmatrix} \exp(-\tfrac{i}{2}(\Delta\phi_1+\Delta\phi_3)) \cdot \cos(\Delta\phi_2/2) & -i\exp(\tfrac{i}{2}(\Delta\phi_1-\Delta\phi_3)) \cdot \sin(\Delta\phi_2/2) \\ -i\exp(-\tfrac{i}{2}(\Delta\phi_1-\Delta\phi_3)) \cdot \sin(\Delta\phi_2/2) & \exp(\tfrac{i}{2}(\Delta\phi_1+\Delta\phi_3)) \cdot \cos(\Delta\phi_2/2) \end{pmatrix}$$
$$= \begin{pmatrix} \cos\alpha & -\sin\alpha \\ \sin\alpha & \cos\alpha \end{pmatrix}$$
--.

Col. 5, line 46, delete "claims" and insert -- claims. --.

Signed and Sealed this
Twenty-third Day of June, 2015

Michelle K. Lee
*Director of the United States Patent and Trademark Office*